United States Patent [19]
Scheler et al.

[11] Patent Number: 5,636,724
[45] Date of Patent: Jun. 10, 1997

[54] DEVICE FOR TRANSFERRING A TRANSPORT OBJECT BETWEEN TWO END POSITIONS

[75] Inventors: Werner Scheler; Juergen Graefe; Andreas Mages; Andreas Birkner; Erich Adler, all of Jena, Germany

[73] Assignee: Jenoptik Technologie GmbH, Jena, Germany

[21] Appl. No.: 396,673

[22] Filed: Mar. 1, 1995

[30] Foreign Application Priority Data

Aug. 31, 1994 [DE] Germany .................. 44 30 846.9

[51] Int. Cl.$^6$ .................................. B65G 47/24
[52] U.S. Cl. .............. 198/375; 198/464.1; 198/468.2; 414/751; 414/940
[58] Field of Search ................. 198/375, 464.1, 198/468.2, 468.4; 414/217, 416, 751–753, 940

[56] References Cited

U.S. PATENT DOCUMENTS

| 2,823,786 | 2/1958 | Grogg | 198/464.1 |
| 3,176,823 | 4/1965 | D'Errico | 198/468.4 |
| 4,802,809 | 2/1989 | Bonora et al. | 414/940 |
| 4,892,180 | 1/1990 | Sticht | 198/375 |
| 4,923,353 | 5/1990 | Tullis et al. | |
| 4,955,775 | 9/1990 | Ohkase et al. | 414/940 |
| 5,220,990 | 6/1993 | Young-Cheol | 198/375 |

FOREIGN PATENT DOCUMENTS

| 0209660 | 1/1987 | European Pat. Off. . |
| 0238541 | 10/1992 | European Pat. Off. . |
| 3714045 | 11/1987 | Germany . |
| 3715601 | 11/1987 | Germany . |
| 4023772 | 3/1991 | Germany . |
| 4326309 | 9/1994 | Germany . |
| WO95/05003 | 2/1995 | WIPO . |

OTHER PUBLICATIONS

Gehen Sie auf's Ganze: Ve langen Sie Systemberatung, 1987.

Elektrische Maschinen und Steuerungstechnik, Horst Flachmann et al., 1980.

Dubbel, Taschenbuch für den Maschinenbau, 1970, pp. 732–733.

Primary Examiner—Joseph E. Valenza
Attorney, Agent, or Firm—McAulay Fisher Nissen Goldberg & Kiel, LLP

[57] ABSTRACT

The object of a device for transferring a transport object between two end positions is to exclude negative influences on dependability and clean room conditions, also in lengthy transport paths, while ensuring a highly flexible transfer. To control the operation of sensors and actuators at a movable part of a drive serving to transfer, electrical contact between these sensors and actuators and a supply unit located in a stationary part of the drive is effected exclusively in the two end positions. The device is provided in particular for use in the manufacture of semiconductors, e.g., for charging semiconductor processing machines, but is not limited to this field.

16 Claims, 7 Drawing Sheets

DEVICE FOR TRANSFERRING A TRANSPORT OBJECT BETWEEN TWO END POSITIONS

BACKGROUND OF THE INVENTION a) Field of the Invention

The present invention is directed to a device for transferring a transport object between two end positions in which a stationary part supports a part which is movable linearly between the end positions by means of a drive, wherein the stationary part contains a supply unit for supplying signal current and motor current to sensors and actuators.

b) Description of the Related Art

In the production of integrated circuits, semiconductor wafers must be transported between different processing steps to individual processing machines. This is effected to an increasing extent in standardized transport containers, so-called Standard Mechanical InterFace boxes (SMIF boxes), since, instead of optimizing conventional clean rooms by way of higher grades of purity to achieve greater density of integration, rigorous implemented use of enclosures or the use of SMIF technology in semiconductor processing installations provides a way to achieve higher yields at reasonable cost.

The semiconductor wafers are inserted into shelves of a magazine which is attached in a suitable manner to the bottom of the SMIF box. In order to charge the semiconductor processing installations, the magazines are first removed from the transport containers. This generally necessitates a transfer which is carried out by various known technical solutions.

For example, in EP 209 660 a cassette is transported from a SMIF elevator to a device elevator by an automated cassette manipulator in that a swiveling movement is effected during the vertical movement for lifting or lowering the cassette. The use of rotating members is intended to reduce the degree of particle generation compared with linearly moving members.

Similar solutions are also described in EP 238 541, in which the magazine is transferred along given movement curves by motor-operated lever arms which are moved in the Z-direction by means of a separate lift.

The laminar flow of air required to maintain the clean room is perturbed or prevented due to the mechanical construction in the known solutions, in particular due to the fact that the region of action of the transfer device, which is constructed as a lever arm, is controlled laterally to the magazine and due to the closed design. Coupling the transfer movement with the Z-movement unnecessarily prolongs transport times and increases particle generation.

Moreover, when refitting semiconductor processing installations, it is difficult in the known technical solutions to supplement already existing clean rooms with the SMIF system so as to allow wafer magazines to be introduced into the machines under SMIF conditions and unpacked and transported in the machines under clean room conditions.

In a technical solution known from DE Patent 43 26 309 C1, a linear drive for a rigid gripper arm is attached to a supporting column for the purpose of transferring the magazine from a depositing position to a processing location, this linear drive being vertically adjustable in the movement direction of the elevator. The range of action of the gripper arm lies above the magazine located in the depositing position and is directed vertically to the movement direction of the elevator. An air passage opening is provided between the supporting column and an elevator drive. All drive parts are separated from the clean room by a dust-tight enclosure and suction devices or extractors are arranged adjacent to openings through which transport elements project into the clean room.

Although the disadvantages mentioned above are eliminated in this way, cables which are carried along over long transporting distances for transmitting signal current and motor current from devices provided for this purpose in the stationary part of the arrangement to movable parts can lead to disturbances and can have a negative impact on dependability. Mechanical reaction of the cable connection on the movable parts and the possibility of particle generation represent a further disadvantage.

Moreover, due to their wide variety, semiconductor processing installations also require different charging and depositing variants for the magazines.

Further, pneumatically operated linear drives have the disadvantage that they are braked very abruptly in end positions on either side of the cylinder by a speed control via throttle check valves in the form of an end position damping. In so doing, braking is effected from the maximum speed to zero along a distance of a few millimeters resulting in inevitable jolting of the transport object.

OBJECT AND SUMMARY OF THE INVENTION

Therefore, the primary object of the present invention is to exclude negative influences on dependability and clean room conditions, also in the case of lengthy transport paths, while ensuring a highly flexible transfer.

This object is met by a device for transferring a transport object between two end positions in which a stationary part supports a part which is movable linearly between the end positions by means of a drive, wherein the stationary part contains a supply unit for supplying signal current and motor current of sensors and actuators at the movable part, in that electrical contacting of the sensors and actuators with the supply unit is effected exclusively in the two end positions for the purpose of controlling the operation of the sensors and actuators.

Construction groups with springing contacts are advantageously provided for electrical contacting, one construction group being supported on the stationary part in the end positions of the movable part and at least one other construction group being supported on the movable part, wherein the springing contacts at the stationary part which are electrically connected with the supply unit face toward the springing contacts on the movable part which have electrical connections to the sensors and actuators.

The springing contacts should be constructed as gold contacts in the form of gold pins which are supported in a springing manner in a sleeve.

By substituting these contact assemblies for the conventional spiral cables, which would otherwise have to be carried along, and by making electrical contact only in the end positions, the reliability of the device is substantially increased, since cable breaks which could occur as a result of the high mechanical strain on carried along cables are ruled out. Another positive result consists in that this substitution eliminates another source of particle generation.

A plate provided with sensors and actuators and held by a movable part of an elevator is used for vertical transfer of the transport object from an upper removing and replacing position to a lower depositing position.

The sensors and actuators can also be component parts of a gripper by which the transport object is transferred substantially horizontally. In this case, it is advantageous to combine the linear movement with a rotational movement of the gripper during at least part of the movement of the movable part.

For this purpose, the gripper and a gripper arm to which the gripper is attached in a rotatable manner and which forms the connection to the drive, are mechanically coupled so as to link the linear movement of the gripper with the rotating movement of the gripper.

In a first construction, the rotatable fastening of the gripper at the gripper arm has a rotational axis directed parallel to the plane of the linear movement and vertically to the linear movement itself.

A first lever connected with the gripper arm is provided for the mechanical coupling of the rotational movement of the gripper with the linear movement. During the linear movement, the first lever senses a connecting member having a difference in height, this first lever being connected, via a rotatably fastened connecting rod, with a second lever fastened to the gripper for transmitting the difference in height and transforming it into the rotational movement.

The first lever is advantageously adjustable with respect to its effective lever length for the purpose of adjusting the angle of rotation of the gripper.

In a second construction, the rotatable fastening of the gripper to the gripper arm has a rotational axis directed vertically to the plane of the linear movement.

For mechanically coupling the rotational movement of the gripper with the linear movement, a driver for a coupling rod supported at the gripper in an eccentrically arranged ball-joint connection and a first stop are attached to a tie rod which is guided and supported in ball circulating guides, this first stop causing the tie rod and driver to remain behind during a forward linear movement of the gripper arm in that the first stop contacts a second stop at the stationary part.

The ball-joint connection advantageously has an adjustable stop system which is acted upon by spring force.

It is also advantageous to provide a pneumatic linear drive for generating the linear movement of the gripper.

At least one pair of parallel-acting throttles with separately adjustable air flow rates is provided at the cylinder of the pneumatic linear drive for controlling the speed in each direction of the linear movement and the number of throttles acting in the direction of the linear movement is controlled by sensor signals depending on the location of the movable part and the direction of the linear movement.

The throttles are advantageously throttle check valves which permit throttling of exhaust air in an adjustable manner and unimpeded passage of air in the movement direction.

For a better understanding of the present invention, reference is made to the following description and accompanying drawings while the scope of the invention will be pointed out in the appended claims.

DESCRIPTION OF THE PREFERRED EMBODIMENTS

Figure 1:
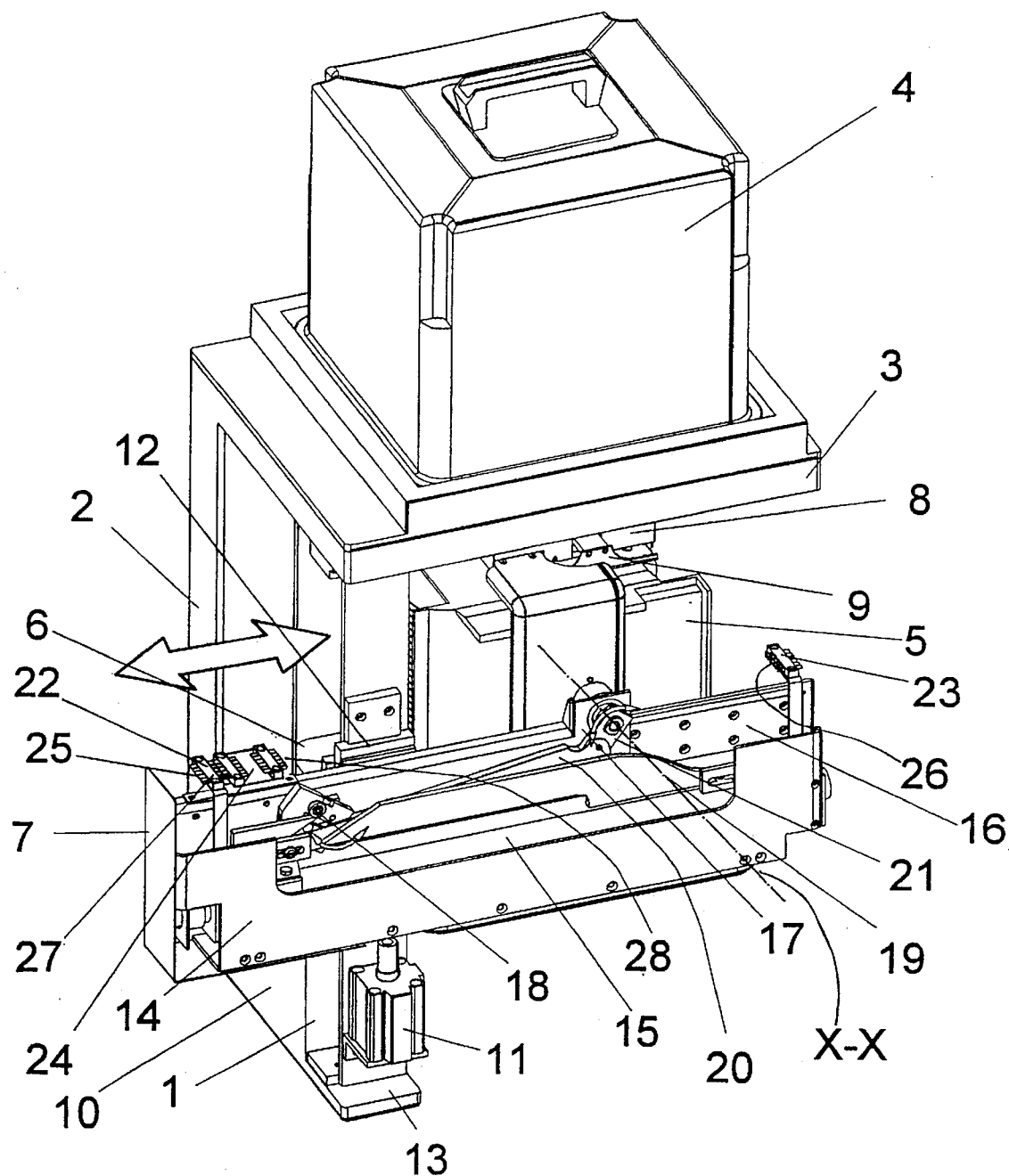
FIG. 1 shows a view of a charging device for rotating a magazine into a "supine position", with movable part in an end position.
Figure 2:
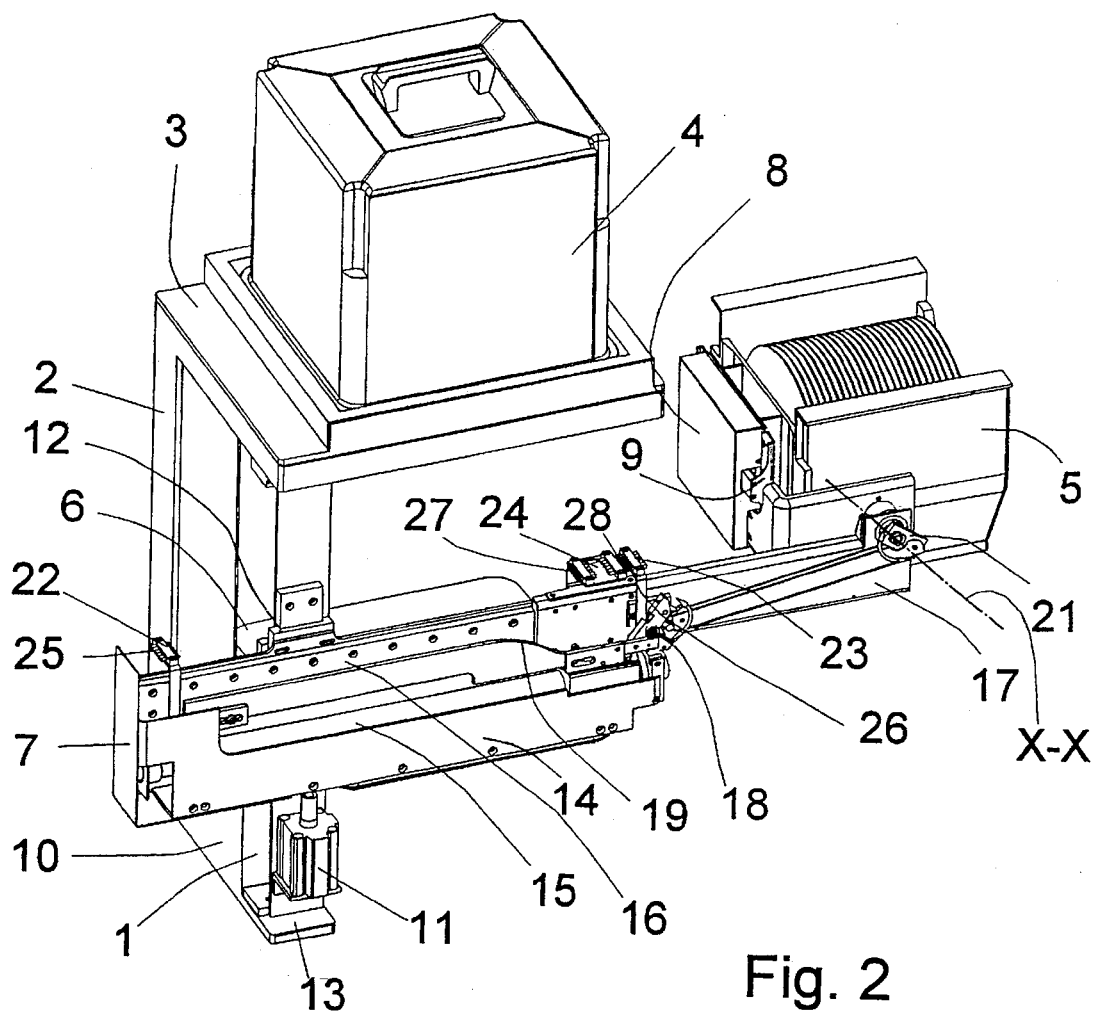
FIG. 2 shows the charging device according to FIG. 1 with the movable part in the other end position.

In FIGS. 1 and 2, a supporting column 1 and a covered elevator drive 2 serve as supporting members for a holder 3 on which a magazine container 4 is deposited, the distance between the column 1 and elevator drive 2 forming an air opening. An elevator which can be moved in the Z-direction by the elevator drive 2 and which is described more fully in DE Patent 43 26 309 C1 is provided with a holding arm for removing and replacing a magazine 5 for wafer-like objects which is located in the magazine container 4.

In the present examples, the magazine 5 is removed from the magazine container 4 together with its base and stands on a plate 6 which can be lowered from the holder 3 and contains the actuators and sensors required for SMIF technology. Thus, it is necessary to determine the state of the magazine container 4, e.g., whether or not it has been deposited or whether or not it is opened or closed.

The elevator has a movable part which is guided in a stationary part so as to be movable between an upper removing and replacing position and a lower depositing position. The upper removing and replacing position and the lower depositing position correspond to a first end position and a second end position of the movable part of the elevator.

A linear drive 7 for a movable gripper 8 is fastened to the supporting column 1. The effective range of the gripper 8 lies above the magazine 5 located in the lower depositing position and is directed vertically to the movement direction of the elevator drive 2.

The gripper arm 8 is provided with the gripping members 9 and sensors, not shown in the drawing, for monitoring the gripping process.

A supply unit 10 is accommodated in the lower region between the column 1 and the elevator drive 2 for supplying signal current and motor current for the linear drive 7, the gripper 8 and its gripping members 9 and a pneumatic short-stroke cylinder 11 which is provided with a rolling guide 12 and serves for adjustment in the Z-axis.

The device in its entirety can be attached to a semiconductor processing installation via a mechanical interface by means of a base plate 13.

A suction device or a variable-speed filter/ventilator unit can be arranged between the column 1 and the elevator drive 2 to generate the air flow indicated by an arrow.

Operating elements and display elements are accommodated in the region of the holder 3. External control electronics have a cable connection to the device which is formed by individual modules which can be fitted by various combinations to a wide range of installations with widely different movement sequences. If desired, it is also possible to realize only individual movement sequences, e.g., the vertical movement of the elevator.

In the linear drive 7, a supporting base plate 14 receives a pneumatic linear cylinder 15 with an internal moving piston and a rolling guide 16 arranged parallel thereto. The linear cylinder 15 and the rolling guide 16 are connected with one another via a gripper arm 17 as movable part, the gripper 8 being attached thereto so as to be rotatable in an adjustable angular region about an axis X—X directed parallel to the plane of the linear movement and vertically to the linear movement itself.

Figure 3:
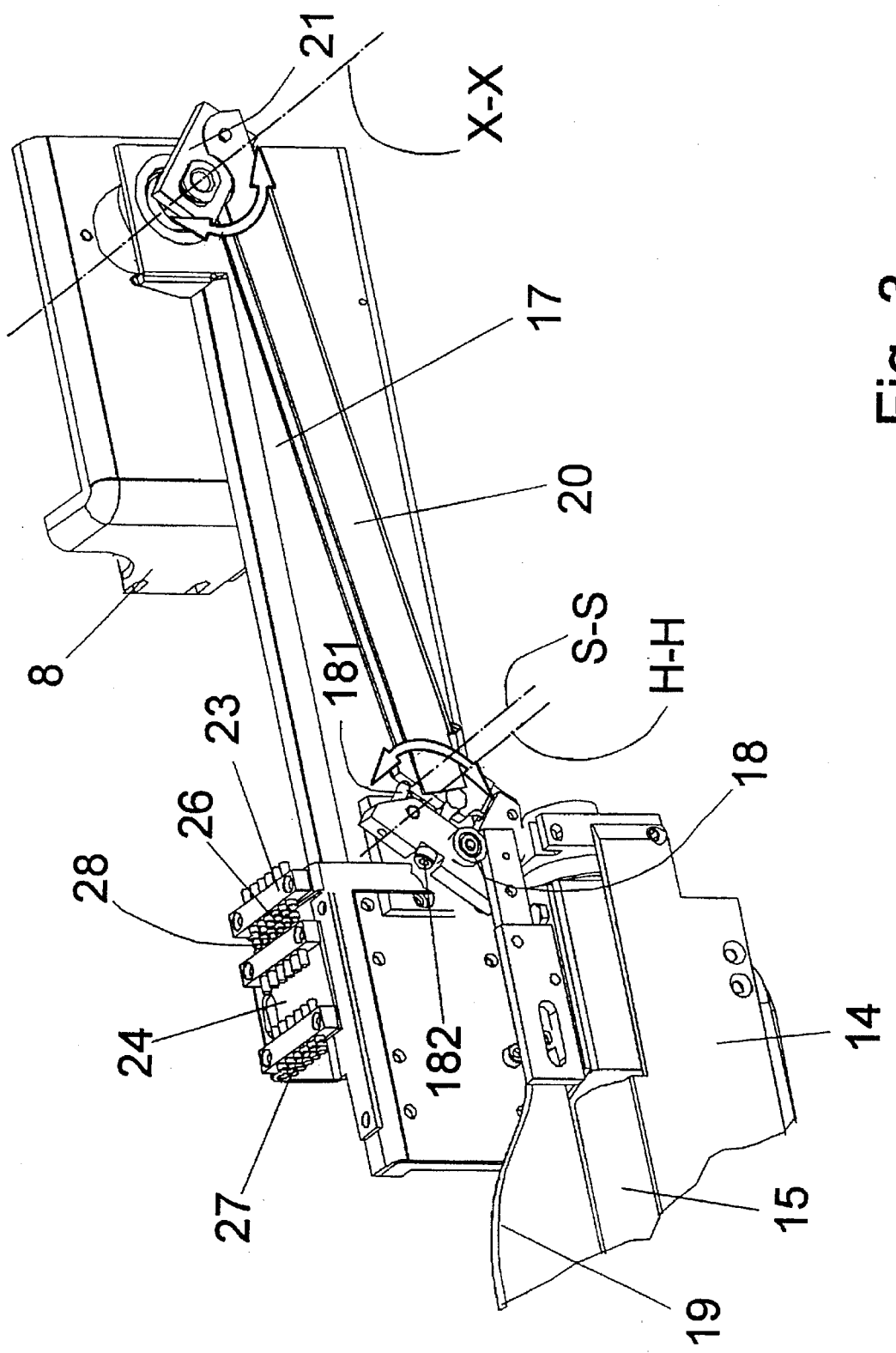
FIG. 3 is an enlarged view showing the rotational movement into the "supine position"mechanically coupled with the linear movement.

A first lever 18 which is rotatable about an axis H—H and senses a connecting member 19 during the linear movement is provided for rotating the gripper 8 about axis X—X as is shown in the enlarged view in FIG. 3. The connecting member 19 has a difference in height which is transmitted to a second lever 21 by means of a connecting rod 20 which is fastened to the first lever 18 so as to be rotatable about an axis S—S, the second lever 21, in turn, forming the connection between the connecting rod 20 and the gripper 8.

The first lever 18 is designed in such a way that its effective lever length and accordingly the rotational angle of the gripper 8 are adjustable. The distance between the rotational axis H—H of lever 18 and the engagement point lying in axis S—S at which the connecting rod 20 serving as a coupling engages is adjusted via an adjusting pin 181 and fixed by a clamping screw 182. Due to a tension spring which is not shown in the drawing, the first lever 18 always contacts the connecting member 19 and the angle of rotation of the tilted gripper 8 is accordingly maintained.

According to FIG. 1, the magazine 5 which is removed from the magazine container and located in the lower depositing position is grasped by the gripper 8 by means of its motor-operated gripping member 9, lifted by a pneumatic lifting movement generated by the short-stroke cylinder 11 and transported by means of the linear drive 7 from a first end position to a second end position of the movable part of the linear drive 7 (magazine location of the semiconductor processing installation). Shortly before reaching the second end position, the gripper 8 and accordingly the magazine 5 are rotated about axis X—X in that the height difference H of the connecting member 19 is transmitted to the second lever arm 21, so that the semiconductor wafers which were previously removable from the magazine 5 from the front now face upward and can be removed in this way.

The rotation is terminated after a linear distance of determined length and the end position is occupied. A lowering movement is effected via the short-stroke cylinder 11 and the magazine 5 is deposited in a fixed manner.

The gripper 8 disengages from the magazine 5 and is moved back in its raised neutral position. The elevator drive 2 has already moved the movable part of the elevator, together with the plate 6 and the base of the magazine container 4, upward into its first end position again so that the magazine container 4 is closed and the magazine can accordingly be exchanged.

After a magazine is introduced into the semiconductor processing installation, an airlock door which may possibly be provided in its magazine movement space can be closed or additional magazines will be introduced into the semiconductor processing installation. The magazines are transported out of the semiconductor processing installation in the reverse order.

Construction groups 22, 23 and 24 serve to transmit signal current and motor current from the supply unit 10 to actuators and sensors of the gripper 8, construction groups 22 and 23 being mounted in a stationary manner at the stationary part in the end positions of the movable part.

Construction group 24 is fastened to the gripper arm 17. Construction groups 22, 23 have springing contacts 25, 26 which face toward springing contacts 27, 28 on construction group 24.

There are electrical connections from springing contacts 25, 26, which are constructed as gold contacts in the form of gold pins supported in a springing manner in a sleeve, to supply unit 10 and from contacts 27, 28 to the sensors and actuators of the gripper 8.

Contacts 25 and 27 contact one another when the gripper is located in the end position as shown in FIG. 1, and contacts 26 and 28 contact one another in the end position shown in FIG. 2 so as to enable the transmission of signal current and motor current.

The gold pins of the contacts 27, 28 at the movable part contact their counterparts on the stationary part with the greatest possible pressure so as to achieve low contact resistance. The required contact pressure is generated via the springs. The working stroke achieved by the springiness brings about temporary electrical contact before departing from the end positions. The supply of current to the gripper 8 is interrupted during the linear movement or rotation of the gripper 8 and is only ensured in the end positions so that a magazine can be taken over or transferred.

Figure 4:
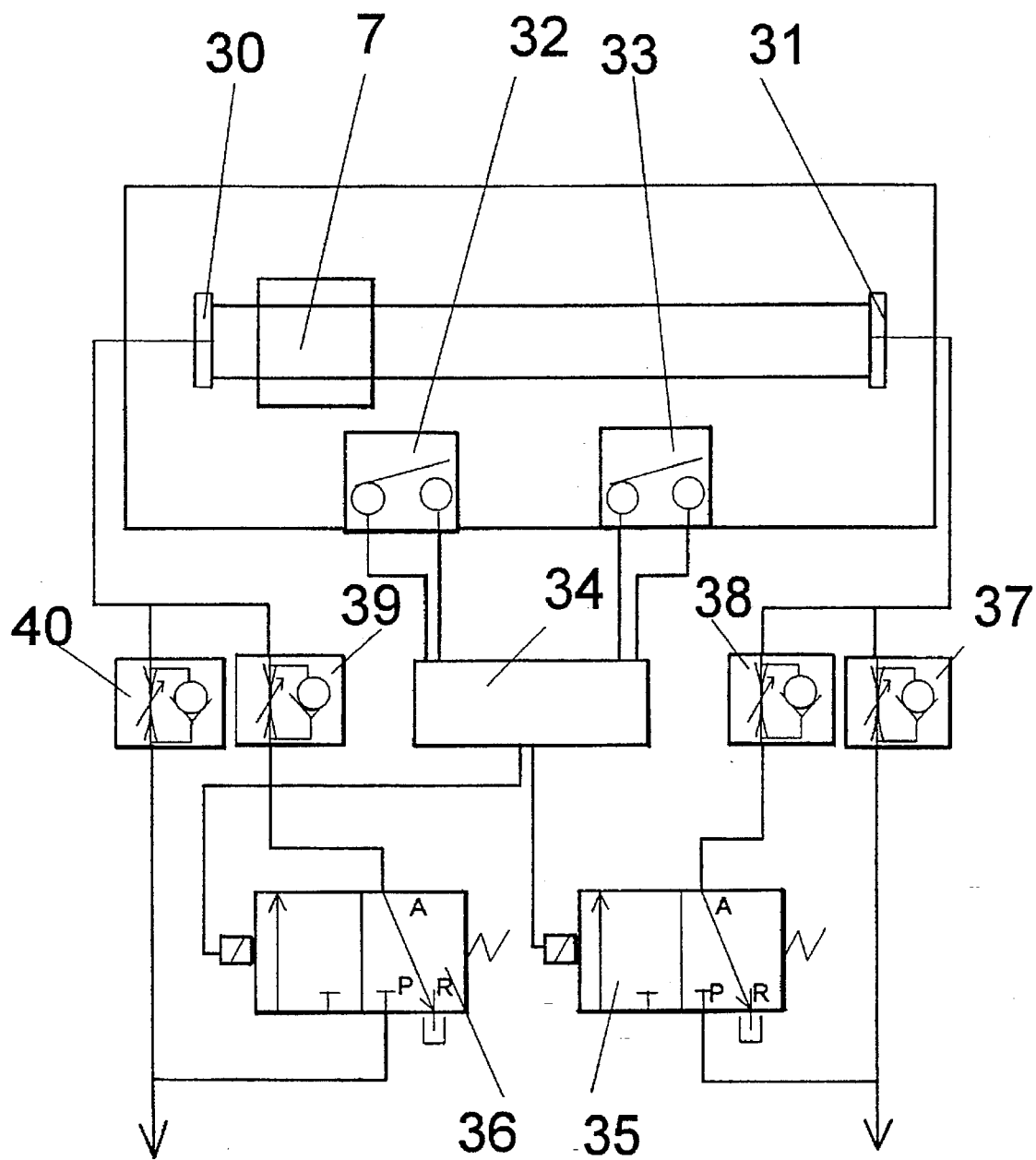
FIG. 4 is a block diagram showing the speed control of the drive.

In a solution for controlling the speed of the pneumatic drive 7 shown in FIG. 4, two sensors 32, 33 are provided along the travel path of the piston so as to be arranged parallel to the linear movement and are adjustable with respect to end positions 30, 31 which are constructed as stationary stops. The sensors 32, 33 are actuated by a trigger part connected with the piston.

Electrical connections lead from the sensors 32, 33 to electronics 34 which convert the pulse signals of the sensors 32, 33 into signals for controlling pneumatic valves 35, 36 depending on the movement direction. A pair of throttle check valves 37, 38 and 39, 40 which are arranged in the exhaust air line of the cylinder is connected with each pneumatic valve 35, 36.

During a movement from end position 30 into end position 31, valve 35 is first opened by sensor 32 so that throttle check valve 38 is connected to throttle check valve 37. A relatively high final speed of the piston results depending on the internal friction of the drive and depending on the setting of the throttle check valves 37, 38.

If movement is effected proceeding from sensor 33, valve 35 is closed and the throttle check valve 38 is accordingly switched off. The speed of the piston is consequently reduced to zero in an almost sinusoidal curve until reaching the end position 31. A gentle approach to end position 31 is achieved. Shaking or movement of the transported wafer in the magazine is prevented.

The switching on of valve 36 occurring as a result of movement past sensor 33 has no effect at first. The throttle check valve 39 which is opened by switching on valve 36 is effective only in the reverse traveling direction from end position 31 to end position 30 and a movement process is effected like that explained in the preceding with reference to the opposite direction. The signal triggered by the actuation of sensor 32 closes valve 36 and, as a result of the switching off of throttle check valve 39, the speed of the piston is reduced and braked to zero until reaching the end position 30 by the action of throttle check valve 40.

In a manner similar to that explained above with respect to travel from end position 30 to end position 31, a renewed opening of the valve 35 caused by actuation of sensor 32 has no effect at first. When travel occurs in the opposite direction, the actuated throttle check valve 38 becomes effective.

The attainable final speeds can be determined by appointing the distance between the sensors 32, 33 and the end positions 30, 31 and adjusting the two associated throttle check valves 37, 38 and 39, 40, respectively.

In the present embodiment example, piston speeds of 100 to 150 mm/s are realized with a distance between the end positions and sensors of 90 to 120 mm. The valves used are 2/2 directional control valves or 3/2 directional control valves with a sealed output.

The exhaust air can be throttled in an adjustable manner by means of the throttle check valves 37, 38, 39 and 40 and air can flow in an unobstructed manner in the movement direction. Throttle check valves 37 and 40 are adjusted in such a way that the piston always approaches the respective end position at a so-called "creeping speed" (extra-slowly).

It is also possible to influence the speed of piston approach by means of electronics 34. The maximum speed is achieved only between the positions being passed at which the sensors 22 and 31 are arranged. Acceleration and braking are effected in the regions between end position 30 and sensor 33 and between sensor 32 and end position 31 or vice versa. The speed of the piston can be influenced in a simple manner by means of this solution.

Figure 5:
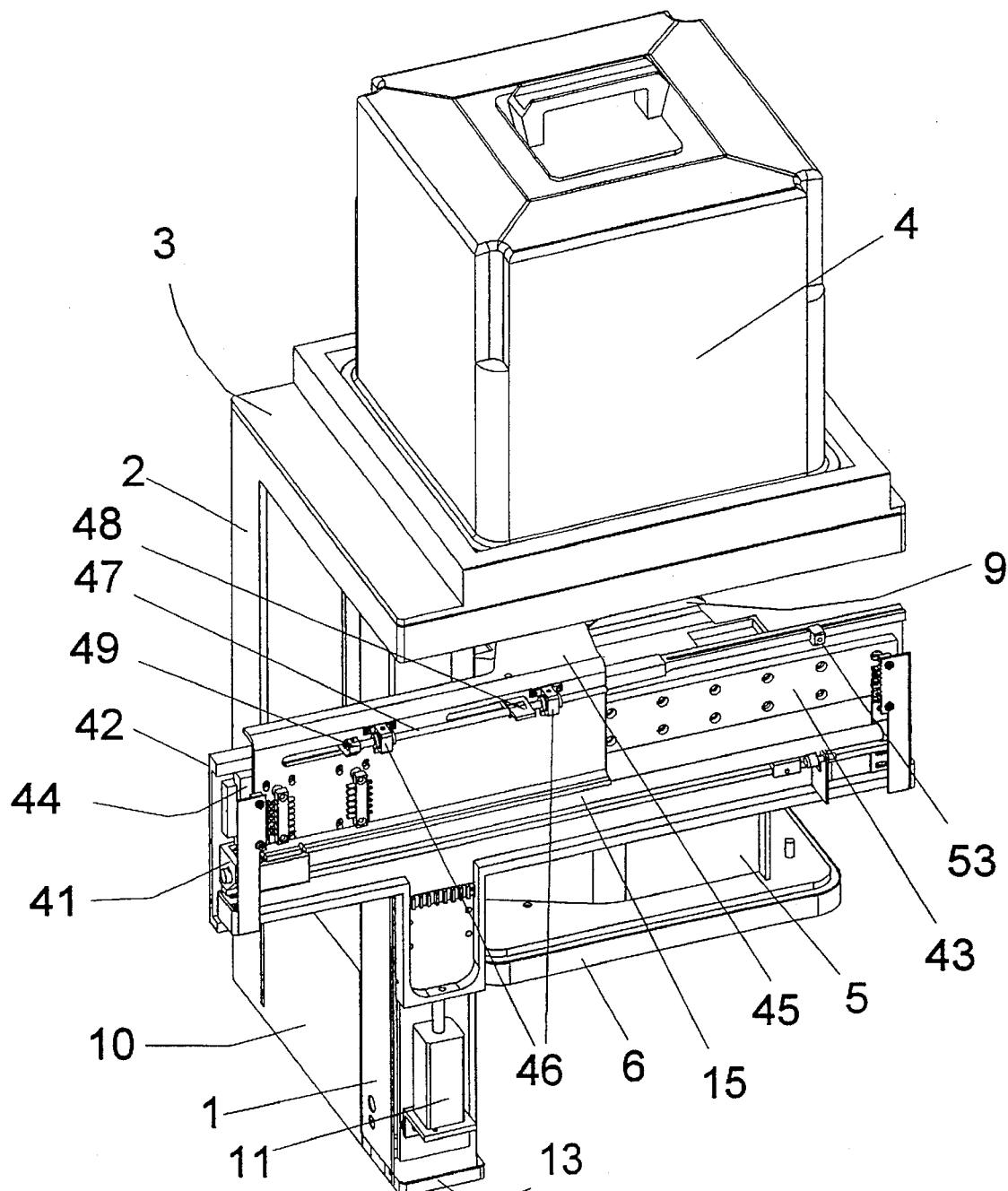
FIG. 5 shows a view of a charging device for rotating a magazine about an axis directed vertically to the plane of the linear movement, with movable part in an end position.
Figure 6:
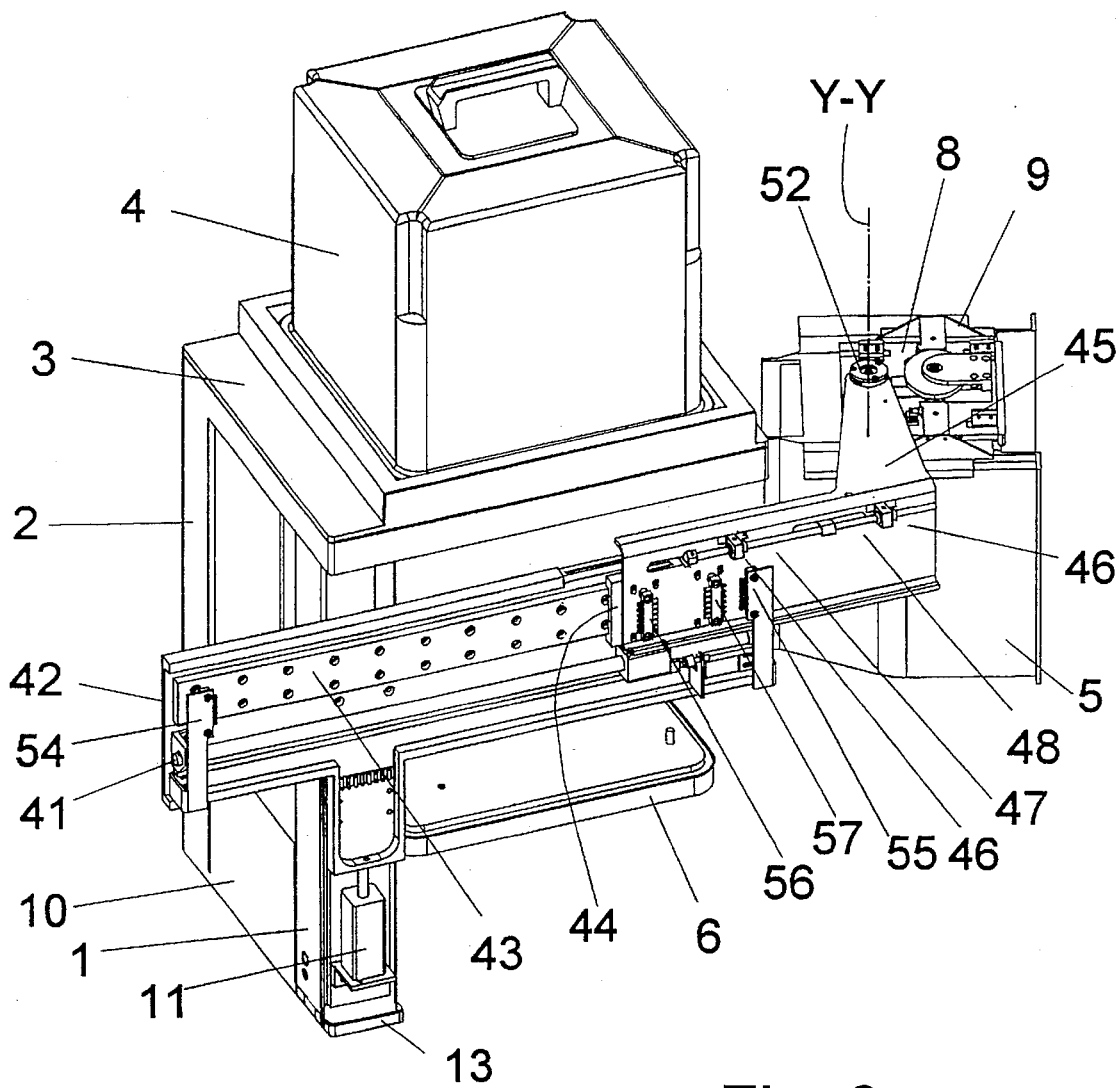
FIG. 6 shows the charging device according to FIG. 5 with the movable part in the other end position.
Figure 7:
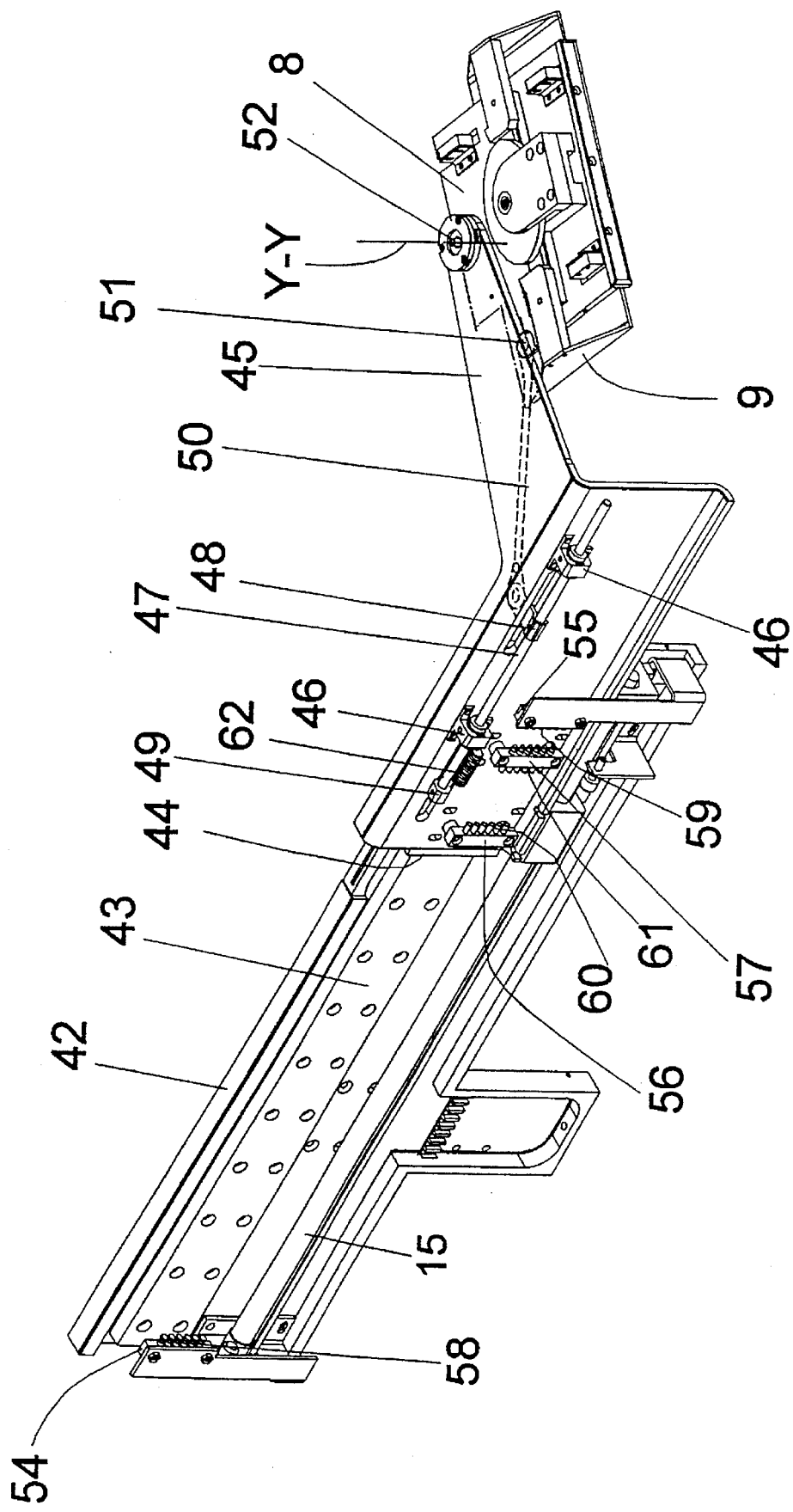
FIG. 7 is an enlarged view showing the rotational movement about an axis directed vertically to the plane of the linear movement mechanically coupled with the linear movement.

The embodiment example according to FIGS. 5 and 6 shows a linear drive 41 with an extensively modified construction compared with FIGS. 1 to 3 for rotating the magazine 8 around an axis directed vertically to the plane of linear movement. Since the charging device in its entirety is constructed in a modular manner, as was already described, component parts of the solution which remain unchanged retain their reference numbers from FIGS. 1 to 3.

The linear drive 41 which, like linear drive 7, is also vertically adjustable in a sliding bearing by means of the short-stroke cylinder 11 contains, on a base plate 42, a guide 43 for a carriage or slide 44 to which a gripper arm 45 is attached. In its upper portion, the gripper arm 45 has a tie rod 47 which is guided and supported by ball circulating guides 46, a driver 48 and a first stop 49 being attached to the tie rod 47 and guided through the gripper arm 45.

The driver 48 is connected with the gripper 8 via a coupling rod 50. An eccentrically arranged ball-joint connection 51 having an adjustable stop system acted upon by spring force serves to support the coupling rod 50. The gripper 8 is supported so as to be rotatable at the gripper arm 45 by a gripper bearing 52 whose rotational axis Y—Y is directed vertically to the plane of linear movement. A second stop 53 is attached to the base plate 42 in such a way that the first stop 49, depending on the location at which it is fastened, contacts the tie rod 47 when the gripper arm 45 moves forward linearly in the direction of the semiconductor processing installation. The tie rod 47 and consequently the driver 48 for the coupling rod 50 are accordingly held back as the linear movement continues causing a rotating movement of the gripper 8 about axis Y—Y of the rotatable fastening of the gripper 8 to the gripper arm 45.

By varying the fastening of the first stop 49 at the tie rod 47 and the fastening of the second stop 53 at the base plate 42, the location at which rotation is initiated and the rotational angle can be adjusted. Such an effect is also brought about by changing the position of the coupling rod 50.

A tension spring 62 is coupled with the driver 48 and, via one of the ball circulating guides 46, with the gripper arm 45 and when the gripper arm 45 moves backward serves to set the initial position for the tie rod 47.

Construction groups 54, 55, 56, 57 with springing contacts 58, 59, 60, 61 which correspond to those shown in FIGS. 1 to 3 with respect to construction and operation serve to transmit signal current and motor current from the supply unit 10 to the actuators and sensors of the gripper 8.

Construction groups with springing contacts which are not shown but are likewise constructed in this way and operate in an identical manner are also provided at the stationary part and movable part of the elevator and, exclusively in the end positions, produce electrical contact between the actuators and sensors at the movable part and the supply unit in the stationary part or in a unit which is connected in a stationary manner with the stationary part.

A mechanical interface which is not described in more detail is provided for connecting the charging device with a semiconductor processing installation or with an available apparatus.

As has already been described in DE Patent 43 26 309 C1, the linear drive, elevator drive and the drive for the gripping members of the gripper are separated from the clean room 30 by means of a dust-tight enclosure. Suction devices are arranged adjacent to openings through which the moved objects, e.g., the gripper, its gripping member and an element for holding the transport object, not described here in more detail, project into the clean room.

While the foregoing description and drawings represent the preferred embodiments of the present invention, it will be obvious to those skilled in the art that various changes and modifications may be made therein without departing from the true spirit and scope of the present invention.

What is claimed is:

1. A device for transferring a transport object between two end positions, comprising:
   a stationary part;
   a movable part, supported by said stationary part, which is linearly movable between said two end positions;
   drive means for moving said movable part;
   sensors and actuators disposed on said movable part;
   a supply unit mounted to said stationary part for supplying signal current and motor current to said sensor and actuators on the movable part; and
   electrical contacts on said stationary part and said movable part for connecting said supply unit to said sensors and actuators exclusively at said two end positions for the purpose of controlling the operation of the sensors and actuators.

2. The device according to claim 1, wherein construction groups with springing contacts are provided for producing electrical contact, one construction group being supported on the stationary part in the end positions of the movable part and at least one other construction group being supported on the movable part, wherein the springing contacts at the stationary part which are electrically connected with the supply unit face toward the springing contacts on the movable part which have electrical connections to the sensors and actuators, said electrical contacts including said springing contacts.

3. The device according to claim 2, wherein the springing contacts are constructed as gold contacts in the form of gold pins which are supported in a springing manner in a sleeve.

4. The device according to claim 1, wherein said stationary part and said movable part are parts of an elevator, said two end positions being an upper removing and replacing position and a lower depositing position, respectively, the sensors and actuators being provided in a plate which is held by said movable part and is used for vertical transfer of the transport object from said upper removing and replacing position to said lower depositing position.

5. The device according to claim 1, wherein the sensors and actuators are component parts of a gripper by which the transport object is transferred substantially horizontally.

6. The device according to claim 5, wherein a rotational movement of the gripper is connected with the linear movement during at least part of the movement of the movable part.

7. The device according to claim 6, wherein the gripper and a gripper arm, to which the gripper is attached in a rotatable manner and which forms the connection to the drive, are mechanically coupled so as to link the linear movement of the gripper with the rotating movement of the gripper.

8. The device according to claim 7, wherein the rotatable fastening of the gripper at the gripper arm has a rotational axis (X—X) directed parallel to the plane of the linear movement and vertically to the linear movement itself.

9. The device according to claim 8, wherein a first lever connected with the gripper arm is provided for the mechanical coupling of the rotational movement of the gripper with the linear movement and, during the linear movement, senses a connecting member having a difference in height, this first lever being connected, via a rotatably fastened connecting rod, with a second lever fastened to the gripper for transmitting the difference in height and transforming it into the rotational movement.

10. The device according to claim 9, wherein the first lever is adjustable with respect to its effective lever length for the purpose of adjusting the angle of rotation of the gripper.

11. The device according to claim 7, the rotatable fastening of the gripper to the gripper arm has a rotational axis (Y—Y) directed vertically to the plane of the linear movement.

12. The device according to claim 11, wherein the purpose of mechanically coupling the rotational movement of the gripper with the linear movement a driver for a coupling rod supported at the gripper in an eccentrically arranged ball-joint connection and a first stop are attached to a tie rod which is guided and supported in ball circulating guides, this first stop causing the tie rod and driver to be held back during a forward linear movement of the gripper arm in that the first stop contacts a second stop at the stationary part.

13. The device according to claim 12, wherein the ball-joint connection has an adjustable stop system which is acted upon by spring force.

14. The device according to claim 5, wherein a pneumatic linear drive is provided for generating the linear movement of the gripper.

15. The device according to claim 14, wherein at least one pair of parallel-acting throttles with separately adjustable air flow rates is provided at the cylinder of the pneumatic linear drive for controlling the speed in each direction of the linear movement, and the number of throttles acting in the direction of the linear movement is controlled by sensor signals depending on the location of the movable part and the direction of the linear movement.

16. The device according to claim 15, the throttles are throttle check valves which permit throttling of exhaust air in an adjustable manner and unimpeded passage of air in the movement direction.

* * * * *